United States Patent
Kim et al.

(10) Patent No.: US 11,925,053 B2
(45) Date of Patent: Mar. 5, 2024

(54) DISPLAY APPARATUS AND METHOD OF MANUFACTURING THE SAME

(71) Applicant: Samsung Display Co., Ltd., Yongin-Si (KR)

(72) Inventors: Hyojung Kim, Yongin-si (KR);
Jungmin Park, Yongin-si (KR);
Jongwoo Park, Yongin-si (KR);
Daeyoun Cho, Yongin-si (KR);
Junehwan Kim, Yongin-si (KR);
Youngjoo Noh, Yongin-si (KR); Sora Bak, Yongin-si (KR); Youngtae Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 257 days.

(21) Appl. No.: 17/365,909

(22) Filed: Jul. 1, 2021

(65) Prior Publication Data

US 2022/0149322 A1    May 12, 2022

(30) Foreign Application Priority Data

Nov. 12, 2020  (KR) ........................ 10-2020-0150996

(51) Int. Cl.
| | | |
|---|---|---|
| *H10K 50/844* | (2023.01) | |
| *H10K 59/12* | (2023.01) | |
| *H10K 71/00* | (2023.01) | |
| *H10K 77/10* | (2023.01) | |

(52) U.S. Cl.
CPC ........... *H10K 50/844* (2023.02); *H10K 71/00* (2023.02); *H10K 77/111* (2023.02); *H10K 59/12* (2023.02); *H10K 59/1201* (2023.02)

(58) Field of Classification Search
None
See application file for complete search history.

(56) References Cited

U.S. PATENT DOCUMENTS

| | | |
|---|---|---|
| 6,544,430 B2 | 4/2003 | McCormack et al. |
| 8,551,825 B2 | 10/2013 | Lee et al. |
| 9,493,614 B2 | 11/2016 | Wakita et al. |
| 9,934,723 B2 | 4/2018 | Lee et al. |
| 10,381,424 B2 | 8/2019 | Ohchi |
| 10,886,480 B2 | 1/2021 | Shin et al. |
| 11,647,665 B2 * | 5/2023 | Shin .......................... C09J 7/38 257/40 |
| 2019/0078208 A1 * | 3/2019 | Lee ....................... C23C 16/505 |
| 2020/0203388 A1 * | 6/2020 | Kim .................... H01L 27/1218 |
| 2021/0202592 A1 * | 7/2021 | Kim ....................... H10K 71/00 |

(Continued)

FOREIGN PATENT DOCUMENTS

| | | |
|---|---|---|
| EP | 0556790 A1 | 8/1993 |
| KR | 10-1063361 B1 | 9/2011 |

(Continued)

*Primary Examiner* — J. E. Schoenholtz
(74) *Attorney, Agent, or Firm* — Innovation Counsel LLP

(57) ABSTRACT

A display apparatus includes a first substrate including a polymer resin, a protective layer on the first substrate, the protective layer including at least one selected from SiOCH, SiOC, SiOF, aromatic amine, diazonium tetrafluoroborate, and an aromatic diazonium compound, and a buffer layer on the protective layer, the buffer layer including a material different from a material included in the protective layer.

18 Claims, 9 Drawing Sheets

(56) References Cited

U.S. PATENT DOCUMENTS

2021/0297054 A1* 9/2021 Hurwitz ............... H03H 9/1014
2022/0069042 A1* 3/2022 Jung ..................... H10K 71/80

FOREIGN PATENT DOCUMENTS

| KR | 10-1255512 B1 | 4/2013 |
| KR | 10-2016-0002337 A | 1/2016 |
| KR | 10-2016-0091027 A | 8/2016 |
| KR | 10-2018-0056646 A | 5/2018 |
| KR | 10-2019-0093232 A | 8/2019 |
| KR | 10-2052445 B1 | 12/2019 |
| KR | 10-2119426 B1 | 6/2020 |
| KR | 10-2139677 B1 | 7/2020 |

* cited by examiner

DISPLAY APPARATUS AND METHOD OF
MANUFACTURING THE SAME

CROSS-REFERENCE TO RELATED APPLICATION

This application is based on and claims priority under 35 U.S.C. § 119 to Korean Patent Application No. 10-2020-0150996, filed on Nov. 12, 2020, in the Korean Intellectual Property Office, the disclosure of which is incorporated by reference herein in its entirety.

BACKGROUND

1. Field

The disclosure relates to a display apparatus and a method of manufacturing the display apparatus, and more particularly, to a display apparatus having an improved reliability and a method of manufacturing the display apparatus.

2. Description of Related Art

Display apparatuses have been used for various purposes. In addition, because the thickness and weight of display apparatuses have been reduced, the range of utilization of display apparatuses has increased. Among the display apparatuses as above, a flexible display apparatus that is portable and formed as a thin flat plate type has been highlighted. Such above flexible display apparatus generally has a light weight and is robust against impact, and has excellent portability because it may be stored in a folded or rolled state.

SUMMARY

However, in a display apparatus according to the related art, a substrate including a polymer resin is used, a polarization occurs in the polymer resin and an afterimage is visible.

One or more embodiments of the disclosure provide a display apparatus having an improved reliability while preventing or reducing a visible afterimage by arranging a protective layer between a substrate including a polymer resin and a barrier layer, and a method of manufacturing the display apparatus. However, the above technical features are example, and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus includes a first substrate including a polymer resin, a protective layer disposed on the first substrate, the protective layer including at least one selected from SiOCH, SiOC, SiOF, aromatic amine, diazonium tetrafluoroborate, and an aromatic diazonium compound, and a buffer layer disposed on the protective layer, the buffer layer including a material different from a material included in the protective layer.

The protective layer may be directly on the first substrate and may be in direct contact with the first substrate.

A ratio of Si—CH3 bonds in the protective layer may be 10% or greater.

A density of the protective layer may be less than 2 g/cm³.

A roughness of the protective layer may be 4.4 nm or less.

The protective layer may be deposited by a plasma-enhanced chemical vapor deposition (PECVD) method.

The protective layer may be deposited by using a radio frequency (RF) power of 60 W to 100 W.

The display apparatus may further include a first barrier layer, wherein the first barrier may be disposed between the protective layer and the buffer layer.

The first barrier layer may include a material different from a material included in the protective layer.

The display apparatus may further include a second substrate disposed below the first substrate, and a second barrier layer disposed between the first substrate and the second substrate.

The display apparatus may further include a thin film transistor disposed on the buffer layer, and an organic light-emitting diode electrically connected to the thin film transistor.

The organic light-emitting diode may include a pixel electrode, an opposite electrode, and an emission layer disposed between the pixel electrode and the opposite electrode.

According to another embodiment, a method of manufacturing a display apparatus includes preparing a first substrate including a polymer resin, forming a protective layer on the first substrate, the protective layer including at least one selected from SiOCH, SiOC, SiOF, aromatic amine, diazonium tetrafluoroborate, and an aromatic diazonium compound, and forming a buffer layer on the protective layer, the buffer layer including a material different from a material included in the protective layer.

In forming of the protective layer on the first substrate, the protective layer may be directly formed on the first substrate and may be in direct contact with the first substrate.

In forming of the protective layer on the first substrate, the protective layer may be formed on the first substrate by a plasma-enhanced chemical vapor deposition (PECVD) method.

The protective layer may be formed by using a radio frequency (RF) power of 60 W to 100 W.

A ratio of Si—CH3 bonds in the protective layer may be 10% or greater.

A density of the protective layer may be less than 2 g/cm³.

A roughness of the protective layer may be 4.4 nm or less.

The method may further include, before the forming of the buffer layer on the protective layer, forming a first barrier layer on the protective layer, wherein the first barrier layer includes a different material from a material included in the protective layer.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
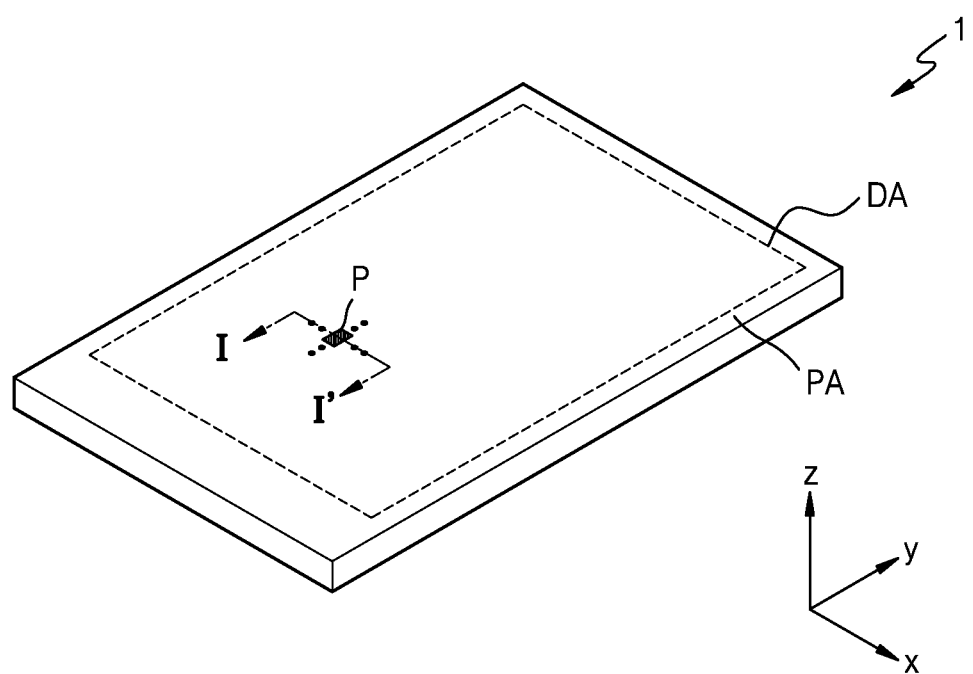
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the specification, the phrase "A and/or B" denotes A, B, or A and B. In addition, the phrase "at least one of A and B" denotes A, B, or A and B.

In the specification herein, a line "extending in a first direction or a second direction" denotes extending in the first direction or the second direction in zig-zags or in a curve, as well as extending straightly in the first direction or the second direction.

Throughout the specification, the phrase "in a plan view" denotes viewing a target portion from the top, and the phrase "in a cross-sectional view" denotes viewing of a cross-section of the target portion that is vertically cut from a lateral direction. Throughout the specification, the expression "overlap" includes overlapping "in a plan view" and overlapping "in a cross-sectional view".

The example embodiments will be described below in more detail with reference to the accompanying drawings. Those components that are the same or are in correspondence are rendered the same reference numeral regardless of the figure number.

FIG. 1 is a perspective view of a display apparatus 1 according to an embodiment.

Referring to FIG. 1, the display apparatus 1 may include a display area DA and a peripheral area PA on a periphery of the display area DA. The peripheral area PA may surround the display area DA. The display device 1 may provide images by using light emitted from pixels P in the display area DA. The peripheral area PA may not display images.

Hereinafter, according to an embodiment, although the display apparatus 1 is described as being an organic light-emitting display apparatus, the disclosure is not limited thereto. In an embodiment, the display apparatus 1 may include an inorganic light-emitting display (or an inorganic EL display apparatus), or a quantum dot light-emitting display apparatus. For example, a light-emitting layer of a display element included in the display apparatus 1 may include an organic material, an inorganic material, quantum dots, an organic material and quantum dots, or an inorganic material and quantum dots.

FIG. 1 shows the display apparatus 1 having a flat display surface, but one or more embodiments are not limited thereto. In an embodiment, the display apparatus 1 may include a three-dimensional display surface or a curved display surface.

When the display apparatus 1 includes a three-dimensional display surface, the display apparatus 1 includes a plurality of display areas directed differently from one another, e.g., a polyprism-type display surface. In an embodiment, when the display apparatus 1 includes a curved display surface, the display apparatus 1 may be implemented in various types, e.g., a flexible display apparatus, a foldable display apparatus, or a rollable display apparatus, etc.

FIG. 1 shows the display apparatus 1 that may be applied to a mobile terminal. Although not shown in FIG. 1, a mobile terminal may be configured by arranging electronic modules, a camera module, a power module, etc. mounted on a main board in a bracket/case together with the display apparatus 1. In particular, the display apparatus 1 may be applied to a large-sized electronic apparatus such as a television, a monitor, etc., and a small-medium size electronic apparatus such as a tablet terminal, a car navigation system, a game console, a smart watch, etc.

Although the display area DA of the display apparatus 1 in FIG. 1 has a rectangular shape, the display area DA may have a circular shape, an elliptical shape, or a polygonal shape such as a triangular shape and a pentagonal shape, etc.

The display apparatus 1 includes a plurality of pixels P in the display area DA. Each of the plurality of pixels P may include an organic light-emitting diode OLED. Each of the plurality of pixels P may emit, for example, red light, green light, blue light, or white light from the organic light-emitting diode OLED. The pixel P may emit red light, green light, blue light, or white light, as described above.

Figure 2:
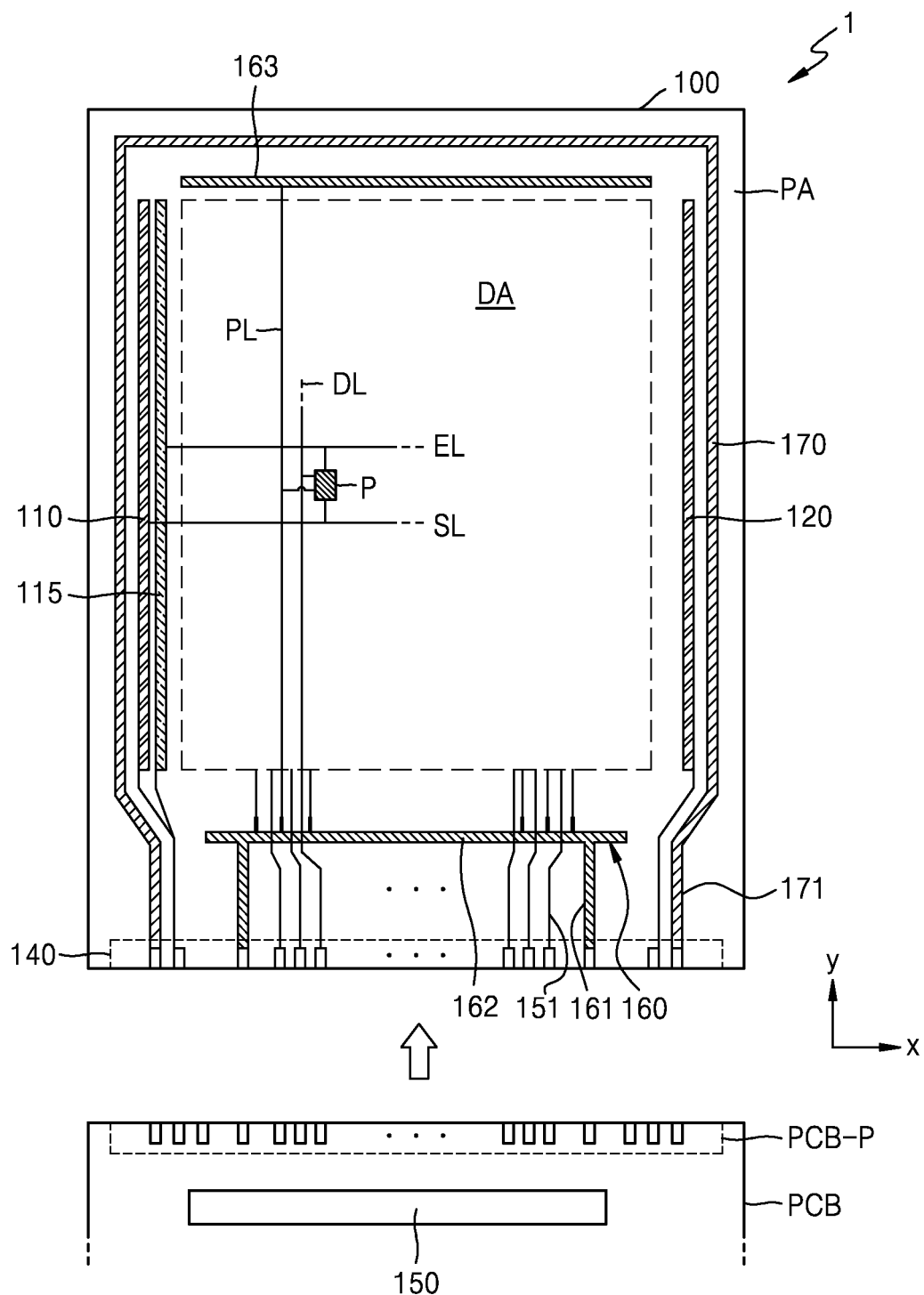
FIG. 2 is a plan view of a display apparatus according to an embodiment.

FIG. 2 is a plan view of the display apparatus 1 according to an embodiment.

Referring to FIG. 2, the display apparatus 1 includes the pixels P in the display area DA. Each of the pixels P may be electrically connected to external circuits in the peripheral area PA. A first scan driving circuit 110, a first emission driving circuit 115, a second scan driving circuit 120, a terminal 140, a data driving circuit 150, a first power supply line 160, and a second power supply line 170 may be in the peripheral area PA.

The first scan driving circuit 110 may provide each pixel P with a scan signal via a scan line SL. The first emission driving circuit 115 may provide each of the pixels P with an emission control signal via an emission control line EL. The second scan driving circuit 120 may be arranged in parallel with the first scan driving circuit 110 with the display area DA therebetween. In an embodiment, some of the pixels P arranged in the display area DA may be electrically connected to the first scan driving circuit 110, and the other pixels P may be electrically connected to the second scan driving circuit 120. In an embodiment, the second scan driving circuit 120 may be omitted.

The first emission driving circuit 115 is apart from the first scan driving circuit 110 in an x-direction on the non-display area NDA. Also, the first emission driving circuit 115 and the first scan driving circuit 110 may be alternately arranged in a Y-direction.

The terminal 140 may be at a side of the substrate 100. The terminal 140 may be exposed by not being covered by an insulating layer and may be electrically connected to a printed circuit board PCB. A terminal PCB-P of the printed circuit board PCB may be electrically connected to the terminal 140 of the display apparatus 1. The printed circuit board PCB may be configured to transfer a signal or power from a controller (not shown) to the display apparatus 1. Control signals generated by the controller may be respectively transferred to the first and second scan driving circuits 110 and 120 and the first emission driving circuit 115 via the printed circuit board PCB. The controller may provide the first power supply line 160 and the second power supply line 170 with a first power voltage ELVDD and a second power voltage ELVSS respectively through a first connecting line 161 and a second connecting line 171. The first power voltage ELVDD is supplied to each pixel P via a lower driving voltage line PL connected to the first power supply line 160, and the second power voltage ELVSS may be provided to an opposite electrode of each pixel P connected to the second power supply line 170.

The data driving circuit 150 may be electrically connected to a data line DL. A data signal of the data driving circuit 150 may be provided to each of the pixels P via a connecting line 151 connected to the terminal 140 and the data line DL connected to the connecting line 151.

Although FIG. 2 shows that the data driving circuit 150 is disposed on the printed circuit board PCB, the data driving circuit 150 may be disposed on the substrate 100 in another embodiment. For example, the data driving circuit 150 may be disposed between the terminal 140 and the first power supply line 160.

The first power supply line 160 may include a first sub-line 162 and a second sub-line 163 that extend in parallel with each other in an X-direction with the display area DA therebetween. The second power supply line 170 has a loop shape having an open side and may partially surround the display area DA.

Figure 3:
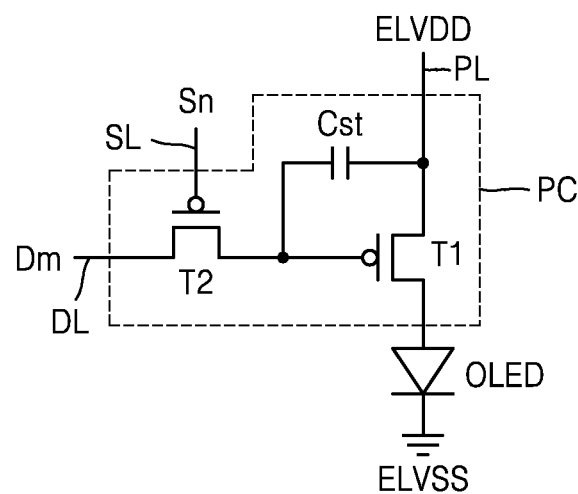
FIGS. 3 and 4 are equivalent circuit diagrams of a pixel included in a display apparatus according to an embodiment.
Figure 4:
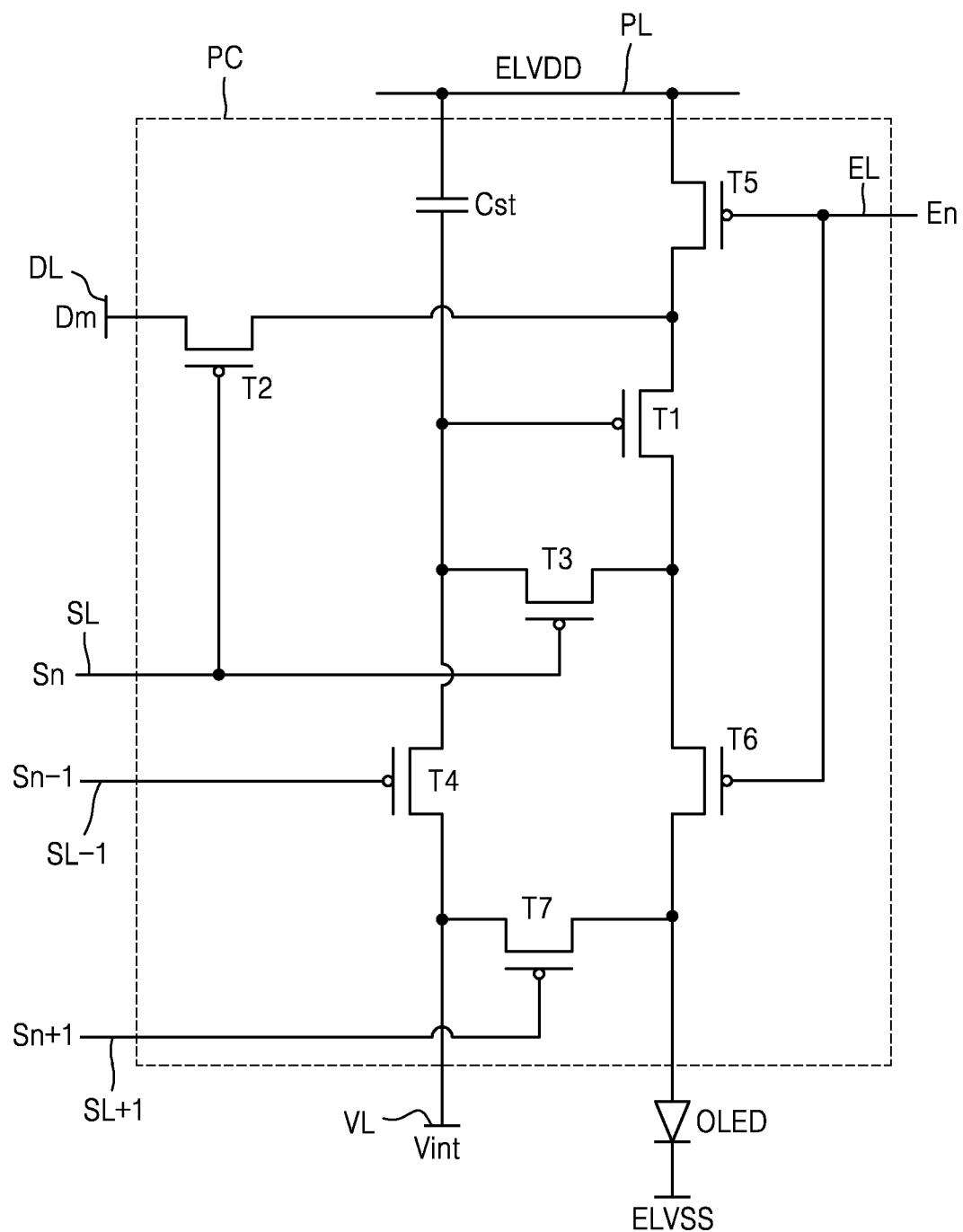

FIGS. 3 and 4 are equivalent circuit diagrams of a pixel included in the display apparatus 1 according to an embodiment.

Referring to FIG. 3, a pixel circuit PC may be connected to the organic light-emitting diode OLED to implement light emission from the pixels P. The pixel circuit PC may include a driving thin film transistor T1, a switching thin film transistor T2, and a storage capacitor Cst. The switching thin-film transistor T2 is connected to the scan line SL and the data line DL and may transfer a data signal Dm input through the data line DL to the driving thin-film transistor T1 according to a scan signal Sn input through the scan line SL.

The storage capacitor Cst is connected to the switching thin film transistor T2 and a driving voltage line PL and may store a voltage corresponding to a difference between a voltage transferred from the switching thin film transistor T2 and a first power voltage ELVDD supplied to the driving voltage line PL.

The driving thin film transistor T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a certain luminance according to the driving current.

FIG. 3 shows an example in which the pixel circuit PC includes two thin film transistors and one storage capacitor, but one or more embodiments are not limited thereto. That is, in another embodiment, the number of transistors can be more than three or four, and the number of the storages capacitor can be more than two.

Referring to FIG. 4, the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

In FIG. 4, every pixel circuit PC includes several signal lines SL, SL−1, SL+1, EL, DL, an initialization voltage line VL, and the driving voltage line PL, but one or more embodiments are not limited thereto. In an embodiment, at least one of the signal lines SL, SL−1, SL+1, EL, and DL, and the initialization voltage line VL may be shared by neighboring pixel circuits.

A drain electrode of the driving thin film transistor T1 may be electrically connected to the organic light-emitting diode OLED via the emission control thin film transistor T6. The driving thin film transistor T1 receives the data signal Dm according to a switching operation of the switching thin film transistor T2 to supply a driving current to the organic light-emitting diode OLED.

A gate electrode of the switching thin film transistor T2 may be connected to the scan line SL, and a source electrode of the switching thin film transistor T2 may be connected to the data line DL. A drain electrode of the switching thin film transistor T2 is connected to a source electrode of the driving thin film transistor T1, and at the same time, may be connected to the driving voltage line PL via the operation control thin film transistor T5.

The switching thin film transistor T2 is turned on according to a scan signal Sn received through the scan line SL and performs a switching operation for transferring the data signal Dm transferred through the data line DL to the source electrode of the driving thin film transistor T1.

A gate electrode of the compensation thin film transistor T3 may be connected to the scan line SL. A source electrode of the compensation thin film transistor T3 is connected to the drain electrode of the driving thin film transistor T1, and at the same time, may be connected to a pixel electrode of the organic light-emitting diode OLED via the emission control thin film transistor T6. A drain electrode of the compensation thin film transistor T3 may be connected to one electrode of the storage capacitor Cst, together with the source electrode of the first initialization thin film transistor T4 and the gate electrode of the driving thin film transistor T1. The compensation thin film transistor T3 is turned on according to the scan signal Sn transferred through the scan line SL, and connects the gate electrode and the drain electrode of the driving thin film transistor T1 to each other for diode-connecting the driving thin film transistor T1.

A gate electrode of the first initialization thin film transistor T4 may be connected to the previous scan line SL−1. The drain electrode of the first initialization thin film transistor T4 may be connected to the initialization voltage line VL. A source electrode of the first initialization thin film transistor T4 may be connected to one electrode of the storage capacitor Cst, together with the drain electrode of the compensation thin film transistor T3 and the gate electrode of the driving thin film transistor T1. The first initialization thin film transistor T4 is turned on according to a scan signal Sn−1 transferred through the previous scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 are simultaneously turned on according to an emission control signal En transferred through the emission control line EL to transfer the first power voltage ELVDD to the organic light-emitting diode OLED, and a driving current flows through the organic light-emitting diode OLED.

A gate electrode of the second initialization thin film transistor T7 may be connected to a post scan line SL+1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin-film transistor T7 is turned on according to a post scan signal Sn+1 transferred through the post scan line SL+1 to initialize the pixel electrode of the organic light-emitting diode OLED.

FIG. 4 shows an example, in which the first initialization thin film transistor T4 and the second initialization thin film transistor T7 are respectively connected to the previous scan line SL−1 and the post scan line SL+1, but one or more embodiments are not limited thereto. In another embodiment, the first initialization thin film transistor T4 and the second initialization thin film transistor T7 may be both connected to the previous scan line SL−1 to be operated according to the previous scan signal Sn−1.

Another electrode of the storage capacitor Cst may be connected to the driving voltage line PL. One electrode of the storage capacitor Cst may be connected to the gate electrode of the driving thin film transistor T1, the drain electrode of the compensating thin film transistor T3, and the source electrode of the first initialization thin film transistor T4.

An opposite electrode (e.g., a cathode) of the organic light-emitting diode OLED may receive a second power voltage ELVSS. The organic light-emitting diode OLED may emit light after receiving a driving current from the driving thin film transistor T1.

The numbers of thin film transistors and storage capacitors and the circuit designs of the thin film transistors and the storage capacitors in the pixel circuit PC is not limited to those illustration in FIG. 4, and the numbers thereof and the circuit designs thereof may vary.

Figure 5:
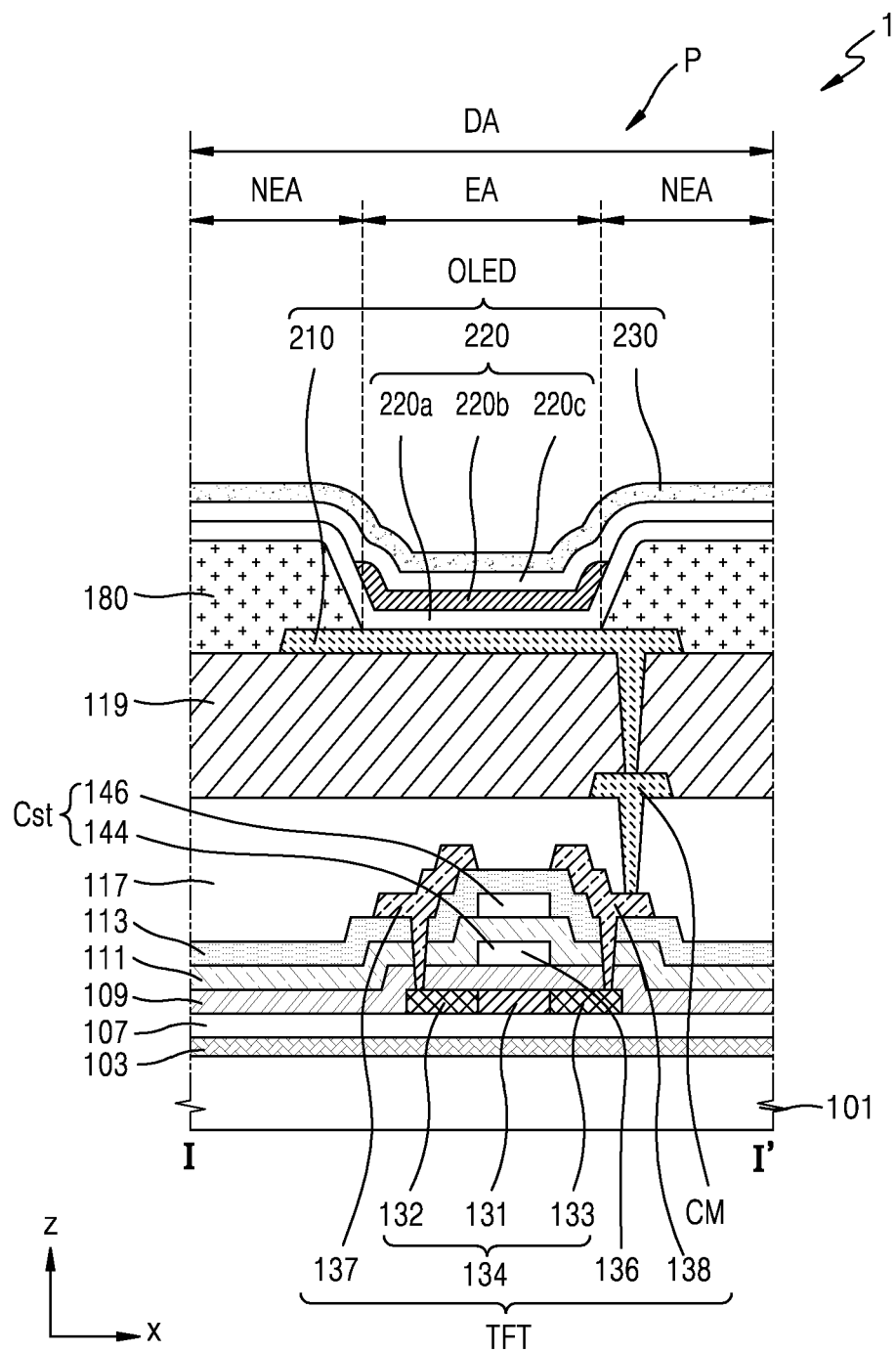
FIG. 5 is a cross-sectional view of a display apparatus according to an embodiment.

FIG. 5 is a cross-sectional view of the display apparatus according to an embodiment.

Hereinafter, a stack structure of the display apparatus will be described briefly with reference to FIG. 5.

Referring to FIG. 5, a first substrate 101 may include a polymer resin which may be flexible, rollable, or bendable. In an embodiment, the first substrate 101 may include polyethersulfone, polyacrylate, polyether imide, polyethylene naphthalate, polyethylene terephthalate, polyphenylene sulfide, polyarylate, polycarbonate, cellulose acetate propionate, etc. In an embodiment, the first substrate 101 may include polyimide. For example, the first substrate 101 may include transparent polyimide.

A buffer layer 107 may be disposed on the first substrate 101. The buffer layer 107 disposed on the first substrate 101 may reduce or block infiltration of impurities, moisture, or external air from a lower portion of the first substrate 101, and provide a flat surface on the first substrate 101. The buffer layer 107 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). In an embodiment, the buffer layer 107 may include silicon oxide ($SiO_2$) or silicon nitride ($SiN_x$). Alternatively, the buffer layer 107 may have a multi-layered structure including silicon oxide ($SiO_x$) and silicon nitride ($SiN_x$).

The thin film transistor TFT may be disposed on the buffer layer 107. The thin film transistor TFT may include a semiconductor layer 134, a gate electrode 136 overlapping the semiconductor layer 134, a source electrode 137, and a drain electrode 138 electrically connected to the semiconductor layer 134. The thin film transistor TFT is connected to the organic light-emitting diode OLED to drive the organic light-emitting diode OLED.

The semiconductor layer 134 is disposed on the buffer layer 107, and may include a channel region 131 overlapping the gate electrode 136, and a source region 132 and a drain region 133 disposed at opposite sides with respect to the channel region 131 and having impurities of higher concentration than that of the channel region 131. In this case, the impurities may include N-type impurities or P-type impurities. The source region 132 and the drain region 133 may be electrically connected to the connecting electrode.

The semiconductor layer 134 may include oxide semiconductor and/or silicon semiconductor. In an embodiment, when the semiconductor layer 134 includes oxide semiconductor, the semiconductor layer 134 may include an oxide material of at least one selected from the group consisting of, for example, indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include ITZO (InSnZnO), IGZO (InGaZnO), etc. In an embodiment, when the semiconductor layer 134 includes silicon semiconductor, the semiconductor layer 134 may include, for example, amorphous silicon (a-Si) or low-temperature polysilicon (LPTS) obtained by crystallizing a-Si.

A first insulating layer 109 may be disposed on the semiconductor layer 134. The first insulating layer 109 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The first insulating layer 109 may have a single-layered or a multi-layered structure including the inorganic insulating material.

The gate electrode 136 may be disposed on the first insulating layer 109. The gate electrode 136 may have a single or multi-layered structure including one or more metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that applies an electrical signal to the gate electrode 136.

A second insulating layer 111 may be disposed on the gate electrode 136. The second insulating layer 111 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The second insulating layer 111 may have a single-layered or a multi-layered structure including the inorganic insulating material.

The storage capacitor Cst including a lower electrode 144 and an upper electrode 146 overlapping the lower electrode 144 may be disposed on the first insulating layer 109. The lower electrode 144 and the upper electrode 146 of the storage capacitor Cst may overlap each other with respect to the second insulating layer 111 therebetween.

In an embodiment, the lower electrode 144 of the storage capacitor Cst overlaps the gate electrode 136 of the thin film transistor TFT, and the lower electrode 144 of the storage capacitor Cst may be integrally provided with the gate electrode 136 of the thin film transistor TFT. In an embodiment, the lower electrode 144 of the storage capacitor Cst may be apart from the gate electrode 136 of the thin film transistor TFT and may be on the first insulating layer 109 as a separate element.

The upper electrode 146 of the storage capacitor Cst may include, for example, aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single-layered or multi-layered structure including the above-stated materials.

A third insulating layer 113 may be disposed on the upper electrode 146 of the storage capacitor Cst. The third insulating layer 113 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The third insulating layer 113 may have a single-layered or a multi-layered structure including the inorganic insulating material.

The source electrode 137 and the drain electrode 138 may be disposed on the third insulating layer 113. The source electrode 137 and the drain electrode 138 may include a conductive material including molybdenum (Mo), aluminum (Al), copper (Cu), titanium (Ti), etc., and may have a single-layered or multi-layered structure including the above materials. The first source electrode 137 and the drain electrode 138 may each have a multi-layered structure including Ti/Al/Ti.

The first planarization layer 117 may be disposed on the source electrode 137 and the drain electrode 138. The first planarization layer 117 may include a single-layered or multi-layered structure including an organic material or an inorganic material. In an embodiment, the first planarization layer 117 may include a general universal polymer such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the first planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), etc. After arranging the first planarization layer 117, a chemical and mechanical polishing may be performed to provide a flat upper surface.

A contact metal layer CM may be disposed on the first planarization layer 117. The contact metal layer CM may include aluminum (Al), copper (Cu), titanium (Ti), etc. and may have a single-layered or multi-layered structure. The contact metal layer CM may have a multi-layered structure including Ti/Al/Ti. In an embodiment, a first contact hole is defined via the first planarization layer 117 so that the contact metal layer CM is electrically connected to the drain electrode 138 (or the source electrode 137).

A second planarization layer 119 may be disposed on the first planarization layer 117 and the contact metal layer CM. The second planarization layer 119 may include a single-layered or multi-layered structure including an organic material or an inorganic material. In an embodiment, the second planarization layer 119 may include the same material as that of the first planarization layer 117. In an embodiment, the second planarization layer 119 may include a different material from that of the first planarization layer 117. After forming the second planarization layer 119, a chemical and mechanical polishing may be performed to provide a flat upper surface. In an embodiment, the second planarization layer 119 may be omitted.

The organic light-emitting diode OLED including the pixel electrode 210, the intermediate layer 220, and the opposite electrode 230 may be disposed on the second planarization layer 119. The pixel electrode 210 may be electrically connected to the contact metal layer CM via a second contact hole penetrating through the third pixel electrode 119. The contact metal layer CM may be electrically connected to the drain electrode 138 (or the source electrode 137) which is the connecting electrode of the thin film transistor TFT via the first contact hole penetrating through the first planarization layer 117, and thus, the organic light-emitting diode OLED may be electrically connected to the thin film transistor TFT.

The pixel electrode 210 may be disposed on the second planarization layer 119. The pixel electrode 210 may include a (semi-) transmissive electrode or a reflective electrode. The pixel electrode 210 may include a reflective layer including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), copper (Cu), and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). The pixel electrode 210 may include a stack structure including ITO/Ag/ITO.

A pixel defining layer 180 may be disposed on the second planarization layer 119, and the pixel defining layer 180 may include an opening at least partially exposing the pixel electrode 210. A region exposed by the opening of the pixel defining layer 180 may be defined as an emission area EA. A periphery of the emission area EA is a non-emission area NEA, and the non-emission area NEA may surround the emission area EA. That is, the display area DA includes a plurality of emission areas EA and the non-emission area NEA surrounding the plurality of emission areas EA. The pixel defining layer 180 increases a distance between the pixel electrode 210 and an opposite electrode 230 disposed on the pixel electrode 210 to prevent generation of arks (or sparks) at the edge of the pixel electrode 210. The pixel defining layer 180 may include, for example, an organic insulating material such as polyimide, polyamide, an acrylic resin, benzocyclobutene, hexamethyldisiloxane (HMDSO), and a phenol resin, and may be obtained by spin coating, etc. In an embodiment, a spacer (not shown) may be further on the pixel defining layer 180.

The intermediate layer 220 may be disposed on the pixel electrode 210 that is at least partially exposed via the pixel defining layer 180. The intermediate layer 220 may include an emission layer 220b, and a first functional layer 220a and a second functional layer 220c that may be selectively provided under and on the emission layer 220b.

In detail, the emission layer 220b of the intermediate layer 220 may be disposed on the pixel electrode 210, which is at least partially exposed through the pixel defining layer 180.

The first functional layer 220a may be disposed below the emission layer 220b, and the second functional layer 220c may be disposed on the emission layer 220b. The first functional layer 220a and the second functional layer 220c which are disposed below and on the emission layer 220b may be totally referred to as organic functional layers.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphor material emitting red, green, blue, or white light. The emission layer 220b may include low-molecular weight organic materials or polymer materials.

When the emission layer 220b includes a low-molecular weight organic material, the intermediate layer 220 may include an HIL, an HTL, the emission layer 220b, an ETL, and an EIL in a single or multiple-layered structure, and examples of the low-molecular weight material may include copper phthalocyanine (CuPc), N,N'-Di(naphthalene-1-yl)-N, N'-diphenyl-benzidine (NPB), and tris-8-hydroxyquinoline aluminum ($Alq_3$).

When the emission layer 220b includes a polymer organic material, the intermediate layer 220 may include an HTL and the emission layer 220b. In this case, the HTL may include PEDOT, and the emission layer may include a poly-phenylenevinylene (PPV)-based or polyfluorene-based polymer material. The emission layer 220b may be arranged by using a screen printing method, an inkjet printing method, a laser induced thermal imaging (LITI) method, etc.

The opposite electrode 230 may be disposed on the intermediate layer 220. The opposite electrode 230 is on the intermediate layer 220, and the opposite electrode 230 may entirely cover the intermediate layer 220. The opposite electrode 230 may be disposed on the display area DA and may entirely cover the display area DA. That is, the opposite electrode 230 may be integrally provided throughout the entire display area so as to cover the pixels P in the display area DA by using an open mask.

The opposite electrode 230 may include a conductive material having a low work function. For example, the opposite electrode 230 may include a (semi-) transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 230 may further include a layer including ITO, IZO, ZnO, or $In_2O_3$ on the (semi-)transparent layer including the above material.

In an embodiment, the organic light-emitting diode OLED may be covered by a thin film encapsulation layer. The thin film encapsulation layer may include at least one inorganic encapsulation layer and at least one organic encapsulation layer. In another embodiment, the organic light-emitting diode OLED may be covered by an encapsulation substrate.

In a case in which the first substrate 101 includes the polymer resin, when a bias (voltage) is applied to lines on the first substrate 101, fluorine (F) ions may be generated in the first substrate 101 due to the bias. Additionally, polarization may occur in the first substrate 101 due to the fluorine (F) ions generated in the first substrate 101, and thus, negative charges are formed between the first substrate 101 and the buffer layer 107. In addition, a threshold voltage shift occurs due to the negative charges, and accordingly, an afterimage is produced.

In an embodiment, a protective layer 103 may be disposed between the first substrate 101 and the buffer layer 107. In an embodiment, the protective layer 103 may be directly disposed on the first substrate 101 so that the protective layer 103 is in direct contact with the first substrate 101.

In an embodiment, the protective layer 103 may include at least one of SiOCH, SiOC, and SiOF. In an embodiment, Si—$CH_3$, Si—C, and/or Si—O bonds may be in the protective layer 103. In an embodiment, the protective layer 103 disposed on the first substrate 101 may be combined with fluorine ions generated in the first substrate 101 to prevent or reduce generation of the polarization in the first substrate 101 and generation of the negative charges between the first substrate 101 and the buffer layer 107, and thus, production of an afterimage on the display apparatus 1 may be prevented or reduced.

In more detail, because the electron affinity of fluorine is greater than that of carbon or oxygen, silicon (Si) in the Si—C and/or Si—O bonds in the protective layer 103 is bonded to the fluorine ions generated in the first substrate 101 to form Si—F bonds, and thus, the Si—C and/or Si—O bonds in the protective layer 103 may be replaced with the Si—F bonds. Furthermore, hydrogen in the Si—CH3 bonds in the protective layer 103 may be substituted with fluorine. Therefore, the fluorine ions generated in the first substrate 101 are bonded or substituted, and thus, the fluorine ions in the first substrate 101 may be consumed. As such, production of the afterimage due to the fluorine ions generated in the first substrate 101 may be prevented or reduced.

In an embodiment, the protective layer 103 disposed on the first substrate 101 can be deposited by a plasma-enhanced chemical vapor deposition (PECVD) method. In this case, the protective layer 103 may be deposited on the first substrate 101 by RF power of about 60 W to about 100 W.

The Si—CH3 bonds may be in the protective layer 103. In an embodiment, as the RF power is lowered, a ratio of the Si—CH3 bonds in the protective layer 103 may increase. However, when the RF power is less than 60 W, a speed of forming the protective layer 103 deposited on the first substrate 101 may be decreased, an adhesiveness with the first substrate 101 may degrade, or a density and uniformity may degrade. On the other hand, when the RF power exceeds 100 W, a ratio of the Si—CH3 bonds in the protective layer 103 may be less than 10%. Then, there may be fluorine ions that are not bonded, and thus, the negative charges are generated between the first substrate 101 and the buffer layer 107 and may cause an afterimage on the display apparatus 1.

Therefore, when the protective layer 103 is formed on the first substrate 101 by the RF power of about 60 W to about 100 W, the ratio of the Si—CH3 bonds may be 10% or greater, and thus, generation of the afterimage in the display apparatus 1 may be prevented or reduced.

In an embodiment, the ratio of the Si—CH3 bonds in the protective layer 103 may be about 10% or greater, a roughness of the protective layer 103 may be about 4.4 mm or less, and a density of the protective layer 103 may be less than about 2 g/cm$^3$.

When the ratio of the Si—CH3 bonds in the protective layer 103 is equal to or greater than about 10%, silicon or carbon in the protective layer 103 is bonded to the fluorine ions generated in the first substrate 101 to form Si—F and/or Si—CF3 (Si—CH2F, Si—CHF2), and thus, generation of the afterimage in the display apparatus 1 may be prevented or reduced.

In an embodiment, the protective layer 103 including a material that may cause a Balz-Schiemann reaction, a Wallach reaction, radiofluorination of diaryliodonium salts, and thermal decomposition of diaryliodonium salts may be formed on the first substrate 101 through a coating process.

In an embodiment, the protective layer 103 may include at least one of aromatic amine, diazonium tetrafluoroborate, and an aromatic diazonium compound. When the protective layer 103 includes at least one of aromatic amine, diazonium tetrafluoroborate, and an aromatic diazonium compound, the above material and the fluorine ions are bonded to each other or fluorine ions are substituted with the above material. Then, generation of the polarization in the first substrate 101 and generation of the negative charges between the first substrate 101 and the buffer layer 107 may be prevented or reduced.

Figure 6:
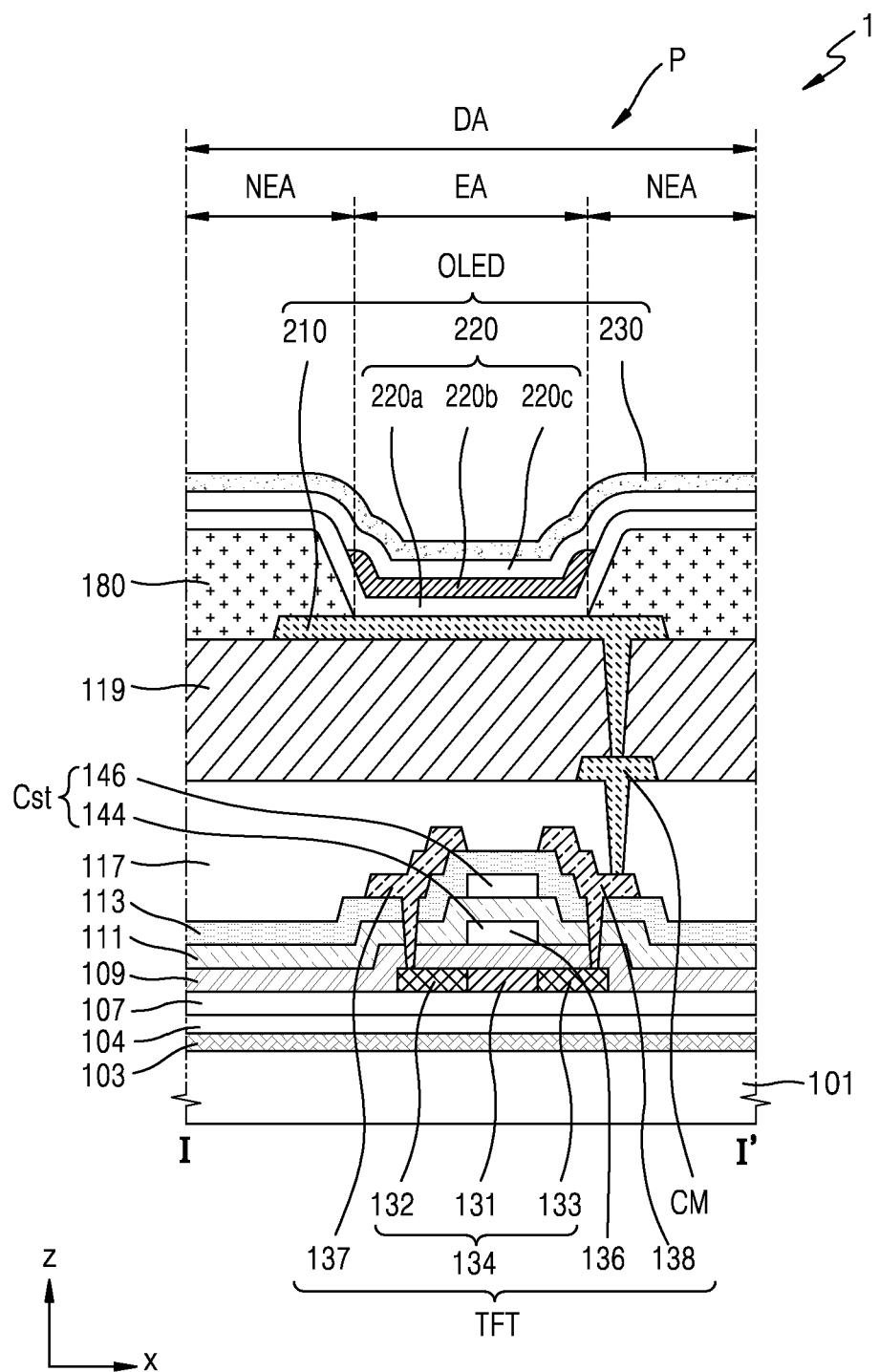
FIG. 6 is a cross-sectional view of a display apparatus according to an embodiment.

FIG. 6 is a cross-sectional view of the display apparatus according to an embodiment. The embodiment of FIG. 6 differs from the embodiment of FIG. 5, in that a first barrier layer 104 is further on the protective layer 103. In FIG. 6, like reference numerals as those of FIG. 5 denote the same members, and detailed descriptions thereof are omitted.

Referring to FIG. 6, the first barrier layer 104 may be disposed between the protective layer 103 and the buffer layer 107. The first barrier layer 104 may reduce or prevent infiltration of impurities, moisture, or external air from the lower portion of the first substrate 101.

In an embodiment, the first barrier layer 104 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). For example, the first barrier layer 104 may include silicon oxide ($SiO_2$).

In an embodiment, the first barrier layer 104 may include the same material as that of the buffer layer 107. For example, both the first barrier layer 104 and the buffer layer 107 may include silicon oxide ($SiO_2$). In an embodiment, the first barrier layer 104 and the buffer layer 107 may include different materials from each other. For example, the first barrier layer 104 may include silicon oxide ($SiO_2$) and the buffer layer 107 may include silicon nitride ($SiN_x$). Alternatively, materials may be variously modified, e.g., the first barrier layer 104 may include silicon nitride ($SiN_x$) and the buffer layer 107 may include silicon oxide ($SiO_2$).

When the protective layer 103 including at least one of SiOCH, SiOC, and SiOF is solely disposed on the first substrate 101, the thin film transistor TFT may be damaged due to the infiltration of the impurities, moisture, or external air from below the protective layer 103, and the density of the protective layer 103 is low so that a deposition uniformity of the films on the protective layer 103 may degrade.

When the protective layer 103 is disposed on the first substrate 101 and the first barrier layer 104 is disposed on the protective layer 103, the infiltration of the impurities, moisture, or external air from below the protective layer 103 may be prevented or reduced, and the deposition uniformity of the films on the first substrate 101 may be improved.

In a case in which the first substrate 101 includes polymer resin, when a bias (voltage) is applied to lines on the first substrate 101, fluorine (F) ions may be generated in the first substrate 101 due to the bias. Additionally, polarization may occur in the first substrate 101 due to the fluorine (F) ions generated in the first substrate 101, and thus, negative charges are formed between the first substrate 101 and the first barrier layer 104. In addition, a threshold voltage shift occurs due to the negative charges, and accordingly, an afterimage is produced.

In an embodiment, a protective layer 103 may be disposed between the first substrate 101 and the first barrier layer 104. In an embodiment, the protective layer 103 may be directly disposed on the first substrate 101 so that the protective layer 103 is in direct contact with the first substrate 101.

In an embodiment, the protective layer 103 may include at least one of SiOCH, SiOC, and SiOF. In an embodiment, Si—CH3, Si—C, and/or Si—O bonds may be in the protective layer 103. In an embodiment, the protective layer 103 on the first substrate 101 may be combined with fluorine ions generated in the first substrate 101 to prevent or reduce generation of the polarization in the first substrate 101 and generation of the negative charges between the first substrate 101 and the first barrier layer 104, and thus, production of an afterimage on the display apparatus 1 may be prevented or reduced.

In more detail, because the electron affinity of fluorine is greater than that of carbon or oxygen, silicon (Si) in the Si—C and/or Si—O bonds in the protective layer 103 is bonded to the fluorine ions generated in the first substrate 101 to form Si—F bonds, and thus, the Si—C and/or Si—O bonds in the protective layer 103 may be replaced with the Si—F bonds. In addition, hydrogen in the Si—CH3 bonds in the protective layer 103 may be substituted with fluorine. As such, production of the afterimage due to the fluorine ions generated in the first substrate 101 may be prevented or reduced.

Figure 7:
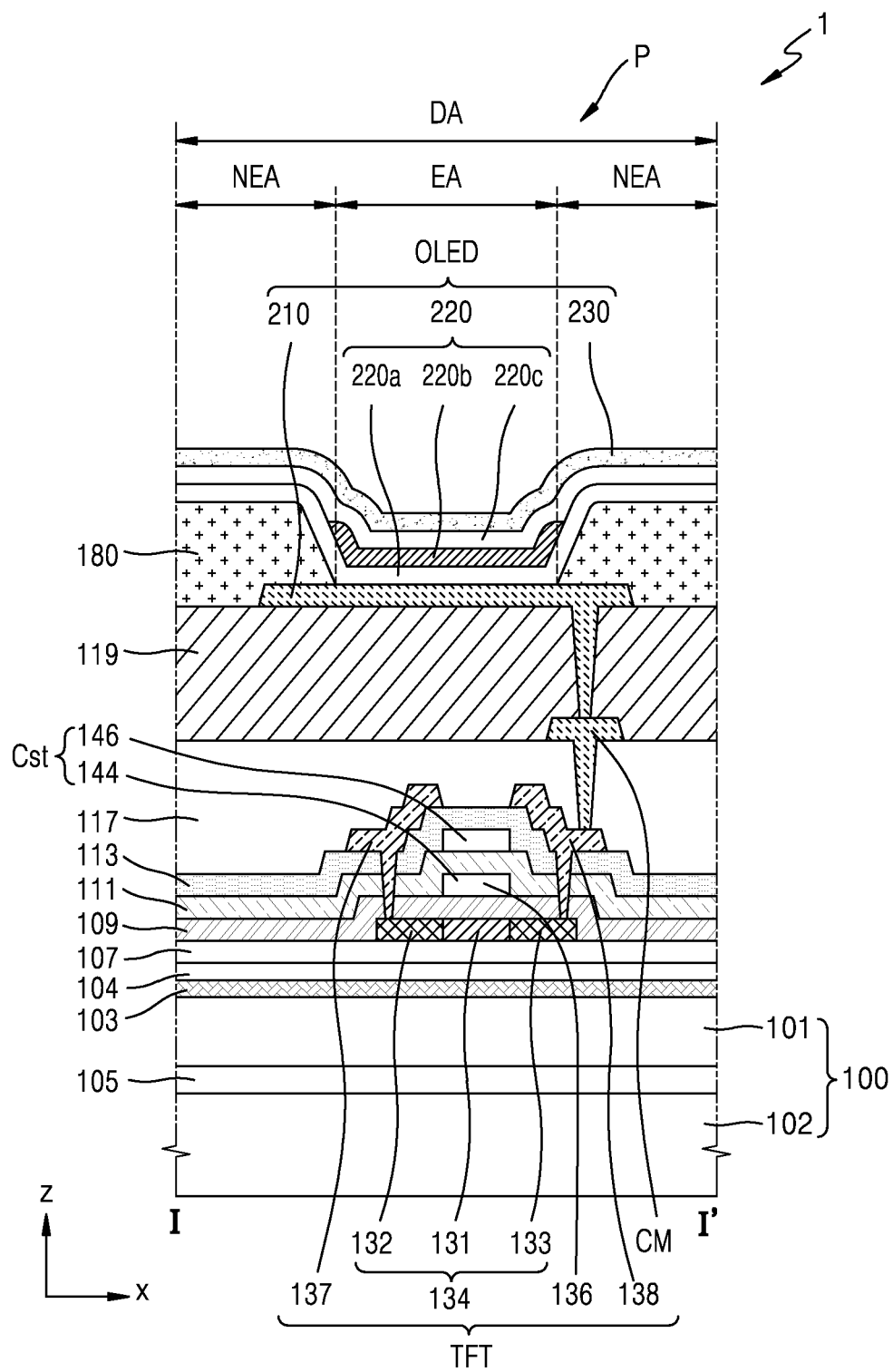
FIG. 7 is a cross-sectional view of a display apparatus according to an embodiment.

FIG. 7 is a cross-sectional view of the display apparatus according to an embodiment. The embodiment of FIG. 7 differs from the embodiment of FIG. 6, in that a second substrate 102 and a second barrier layer 105 are further disposed below the first substrate 101. In FIG. 7, like reference numerals as those of FIG. 6 denote the same members, and detailed descriptions thereof are omitted.

Referring to FIG. 7, the substrate 100 may include the first substrate 101 and the second substrate 102. The second substrate 102 may be disposed below the first substrate 101. The second substrate 102 may include a polymer resin. The second substrate 102 including the polymer resin may be flexible, rollable, or bendable. In an embodiment, the second substrate 102 may include polyethersulfone, polyacrylate, polyether imide, polyethylene naphthalate, polyethylene terephthalate, polyphenylene sulfide, polyarylate, polycarbonate, cellulose acetate propionate, etc. In an embodiment, the second substrate 102 may include the same material as that of the first substrate 101. For example, the second substrate 102 may include polyimide. In an embodiment, the second substrate 102 may include a different material from that of the first substrate 101.

The second barrier layer 105 may be disposed between the first substrate 101 and the second substrate 102. The second barrier layer 105 may prevent or reduce infiltration of impurities, moisture, or external air from a lower portion of the second substrate 102. The second barrier layer 105 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). In an embodiment, the second barrier layer 105 may include the same material as that of the first barrier layer 104. In an embodiment, the second barrier layer 105 may include a different material from that of the first barrier layer 104.

FIGS. 8, 9, 10, and 11 are cross-sectional views for describing a method of manufacturing a display apparatus, according to an embodiment.

Hereinafter, a method of manufacturing a display apparatus will be described sequentially with reference to FIGS. 8, 9, 10, and 11.

The method of manufacturing the display apparatus according to the embodiment may include a process of preparing the first substrate 101 including the polymer resin, a process of forming the protective layer 103 including at least one of SiOCH, SiOC, and SiOF on the first substrate 101, and a process of forming the buffer layer 107 on the protective layer 103, the buffer layer 107 including a different material from that of the protective layer 103.

In an embodiment, a process of forming the first barrier layer 104 on the protective layer 103 may be performed between the process of forming the protective layer 103 on the first substrate 101 and the process of forming the buffer layer 107 on the protective layer 103.

Figure 8:
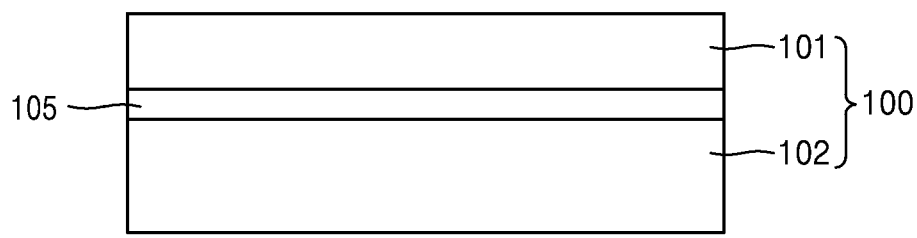
FIGS. 8, 9, 10, and 11 are cross-sectional views for describing a method of manufacturing a display apparatus, according to an embodiment.

Referring to FIG. 8, in the process of preparing the first substrate 101 including the polymer resin, the first substrate 101 may be formed on the second substrate 102 on which the second barrier layer 105 is formed. For example, the second substrate 102, the second barrier layer 105, and the first substrate 101 may be sequentially stacked.

The substrate 100 may include the first substrate 101 and the second substrate 102. In an embodiment, the material of the first substrate 101 may be the same as that of the second substrate 102. For example, the first substrate 101 and the second substrate 102 may both include polyimide. In an embodiment, the first substrate 101 and the second substrate 102 may include different materials from each other.

Figure 9:
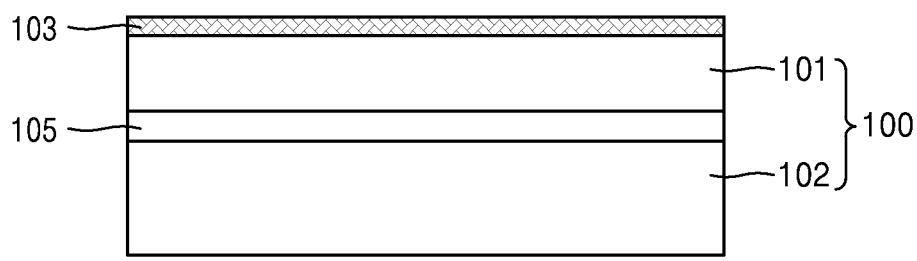

After that, referring to FIG. 9, the process of forming the protective layer 103 on the first substrate 101 including the polymer resin may be performed. The protective layer 103 may be directly formed on the first substrate 101. The protective layer 103 may be formed on the first substrate 101 by the plasma-enhanced chemical vapor deposition (PECVD) method. In this case, the protective layer 103 may be formed by using RF power of about 60 W to about 100 W.

In an embodiment, the protective layer 103 may include at least one of SiOCH, SiOC, and SiOF. In an embodiment, a ratio of Si—CH3 bonds in the protective layer 103 may be about 10% or greater, the density of the protective layer 103 may be less than about 2 $g/cm^3$, and the roughness of the protective layer 103 may be about 4.4 nm or less.

Because the electron affinity of fluorine is greater than that of carbon or oxygen, silicon (Si) in the Si—C and/or Si—O bonds in the protective layer 103 is bonded to the fluorine ions generated in the first substrate 101 to form Si—F bonds, and thus, the Si—C and/or Si—O bonds in the protective layer 103 may be replaced with the Si—F bonds. Additionally, hydrogen in the Si—CH3 bonds in the protective layer 103 may be substituted with fluorine. As such, production of the afterimage due to the fluorine ions generated in the first substrate 101 may be prevented or reduced.

Figure 10:
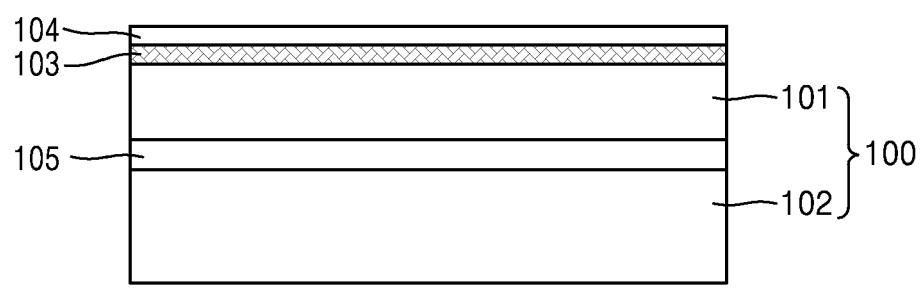

After that, referring to FIG. 10, the process of forming the first barrier layer 104 on the protective layer 103 may be further performed. The first barrier layer 104 may be formed on the protective layer 103 by a PECVD method. The first barrier layer 104 may be disposed on the first substrate 101 to reduce or prevent infiltration of impurities, moisture, or external air from the lower portion of the first substrate 101.

When the protective layer 103 including at least one of SiOCH, SiOC, and SiOF is solely on the first substrate 101, the thin film transistor TFT may be damaged due to the infiltration of the impurities, moisture, or external air from below the protective layer 103, and the density of the protective layer 103 is low so that a deposition uniformity of the films on the protective layer 103 may degrade.

When the protective layer 103 is disposed on the first substrate 101 and the first barrier layer 104 is disposed on the protective layer 103, the infiltration of the impurities, moisture, or external air from below the protective layer 103 may be prevented or reduced, and the deposition uniformity of the films on the first substrate 101 may be improved.

In an embodiment, the material of the first barrier layer 104 may be the same as that of the second barrier layer 105. For example, both the first barrier layer 104 and the second barrier layer 105 may include silicon oxide ($SiO_2$). In an embodiment, the first barrier layer 104 and the second barrier layer 105 may include different materials from each other.

In an embodiment, the first barrier layer 104 may be omitted. In this case, the buffer layer 107 may include the same material as that of the first barrier layer 104 and may function as the first barrier layer 104.

Figure 11:
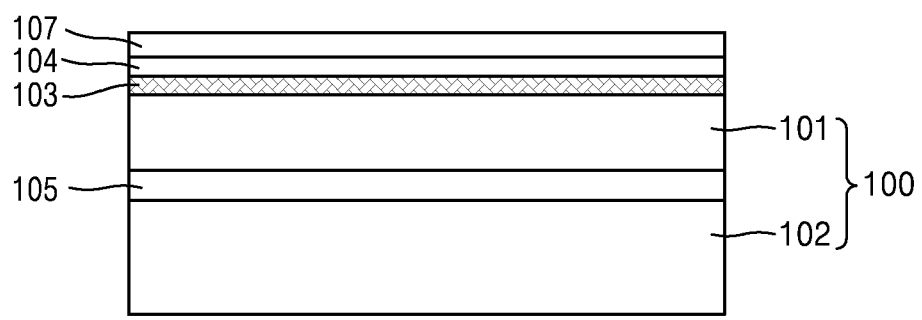

After that, referring to FIG. 11, the process of forming the buffer layer 107 on the first barrier layer 104 may be performed. The buffer layer 107 is disposed on the first substrate 101 to reduce or block infiltration of impurities, moisture, or external air from a lower portion of the first substrate 101, and to provide a flat surface on the first substrate 101.

In an embodiment, the buffer layer 107 may be formed on the first barrier layer 104 by a PECVD method. In an embodiment, the buffer layer 107 may include the same material as that of the first barrier layer 104. For example, both the buffer layer 107 and the first barrier layer 104 may include silicon oxide ($SiO_2$). In an embodiment, the buffer layer 107 and the first barrier layer 104 may include different materials from each other. For example, the first barrier layer 104 may include silicon oxide ($SiO_2$) and the buffer layer 107 may include silicon nitride ($SiN_x$). Alternatively, materials may be variously modified, e.g., the first barrier layer 104 may include silicon nitride ($SiN_x$) and the buffer layer 107 may include silicon oxide ($SiO_2$).

After that, although not shown herein, the thin film transistor TFT, the organic light-emitting diode OLED, etc. may be additionally formed on the buffer layer 107.

In an embodiment, the protective layer 103 including at least one of SiOCH, SiOC, and SiOF is disposed on the first substrate 101 so as to consume the fluorine ions generated in the first substrate 101. Thus, forming of the negative charges in the first substrate 101 and the first barrier layer 104 (or the buffer layer 107) due to the polarization generated in the first substrate 101 may be prevented or reduced.

In an embodiment, forming of the negative charges in the first substrate 101 and the first barrier layer 104 (or the buffer layer 107) may be prevented or reduced. Thus, generation of the threshold voltage shift due to the negative charges and production of the afterimage may be prevented or reduced.

In an embodiment, a PECVD method is used, and thus, the protective layer 103 may be formed on the first substrate 101 without performing an additional mask process.

In addition, the barrier layer (first barrier layer 104 and/or second barrier layer 105) and the buffer layer 107 are formed by a PECVD method. Thus, the protective layer 103 may be formed on the first substrate 101 without adding new deposition equipment. That is, mass production of the display apparatus 1 may be improved.

According to the embodiment as above, the protective layer is disposed between the substrate and the barrier layer. Thus, the display apparatus and the method of manufacturing the display apparatus, in which visual recognition of the afterimage may be prevented or reduced, and product reliability may be improved. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first substrate including a polymer resin;
a protective layer disposed on the first substrate, the protective layer including at least one selected from SiOCH, SiOC, and SiOF; and
a buffer layer disposed on the protective layer, the buffer layer including a material different from a material included in the protective layer;
wherein the protective layer is directly on the first substrate and is in direct contact with the first substrate.

2. The display apparatus of claim 1, wherein a ratio of Si—CH3 bonds compared to Si—C bonds and Si—O bonds in the protective layer is about 10%.

3. The display apparatus of claim 2, wherein a density of the protective layer is about 2 $g/cm^3$.

4. The display apparatus of claim 2, wherein a roughness of the protective layer is about 4.4 nm.

5. The display apparatus of claim 1, wherein the protective layer is deposited by a plasma-enhanced chemical vapor deposition (PECVD) method.

6. The display apparatus of claim 5, wherein the protective layer is deposited by using radio frequency (RF) power of 60 W to 100 W.

7. The display apparatus of claim 1, further comprising a first barrier layer, wherein the first barrier is disposed between the protective layer and the buffer layer.

8. The display apparatus of claim 7, wherein the first barrier layer includes a material different from a material included in the protective layer.

9. The display apparatus of claim 7, further comprising:
a second substrate disposed below the first substrate; and
a second barrier layer disposed between the first substrate and the second substrate.

10. The display apparatus of claim 1, further comprising:
a thin film transistor disposed on the buffer layer; and
an organic light-emitting diode electrically connected to the thin film transistor.

11. The display apparatus of claim 10, wherein the organic light-emitting diode includes a pixel electrode, an opposite electrode, and an emission layer disposed between the pixel electrode and the opposite electrode.

12. A method of manufacturing a display apparatus, the method comprising steps of:
preparing a first substrate including a polymer resin;
forming a protective layer on the first substrate, the protective layer including at least one selected from SiOCH, SiOC, and SiOF; and
forming a buffer layer on the protective layer, the buffer layer including a material different from a material included in the protective layer;
wherein, in forming of the protective layer on the first substrate, the protective layer is directly formed on the first substrate and is in direct contact with the first substrate.

13. The method of claim 12, wherein, in forming of the protective layer on the first substrate, the protective layer is formed on the first substrate by a plasma-enhanced chemical vapor deposition (PECVD) method.

14. The method of claim 13, wherein the protective layer is formed by using radio frequency (RF) power of 60 W to 100 W.

15. The method of claim 12, wherein a ratio of Si—CH3 bonds compared to Si—C bonds and Si—O bonds in the protective layer is about 10%.

16. The method of claim 12, wherein a density of the protective layer is about 2 $g/cm^3$.

17. The method of claim 12, wherein a roughness of the protective layer is about 4.4 nm.

18. The method of claim 12, further comprising a step of:
before forming of the buffer layer on the protective layer, forming a first barrier layer on the protective layer, wherein the first barrier layer includes a different material from a material included in the protective layer.

\* \* \* \* \*